United States Patent
Tanaka et al.

(10) Patent No.: US 11,536,748 B2
(45) Date of Patent: Dec. 27, 2022

(54) CURRENT SENSOR

(71) Applicant: AISIN CORPORATION, Kariya (JP)

(72) Inventors: Tomoya Tanaka, Kariya (JP); Takashi Hara, Kariya (JP); Hiromu Kinoshita, Kariya (JP)

(73) Assignee: AISIN CORPORATION, Kariya (JP)

( * ) Notice: Subject to any disclaimer, the term of this patent is extended or adjusted under 35 U.S.C. 154(b) by 0 days.

(21) Appl. No.: 17/305,881

(22) Filed: Jul. 16, 2021

(65) Prior Publication Data
US 2022/0043034 A1 Feb. 10, 2022

(30) Foreign Application Priority Data
Aug. 4, 2020 (JP) .............................. JP2020-132252

(51) Int. Cl.
*G01R 15/20* (2006.01)
*G01R 19/00* (2006.01)
(52) U.S. Cl.
CPC ....... *G01R 15/202* (2013.01); *G01R 19/0092* (2013.01)
(58) Field of Classification Search
CPC .. G01R 15/202; G01R 19/0092; G01R 19/32; G01R 35/005
USPC ...................................................... 324/126
See application file for complete search history.

(56) References Cited

U.S. PATENT DOCUMENTS

| 2012/0283970 | A1* | 11/2012 | Boehm | G01R 31/3828 |
| | | | | 702/64 |
| 2016/0065067 | A1* | 3/2016 | Isham | G01K 13/00 |
| | | | | 323/271 |
| 2016/0341772 | A1* | 11/2016 | Roberts | G01R 35/005 |
| 2019/0079117 | A1* | 3/2019 | Hurwitz | G01R 1/203 |
| 2019/0113550 | A1* | 4/2019 | Hong | G01R 33/0082 |
| 2019/0317136 | A1* | 10/2019 | Roberts | G01R 19/32 |
| 2019/0346528 | A1* | 11/2019 | Dang | G01R 35/005 |

FOREIGN PATENT DOCUMENTS

| JP | 2019-100923 A | 6/2019 |
| WO | WO 2013/011859 A1 | 1/2013 |

* cited by examiner

*Primary Examiner* — Tung X Nguyen
*Assistant Examiner* — Robert P Alejnikov, Jr.
(74) *Attorney, Agent, or Firm* — Oblon, McClelland, Maier & Neustadt, L.L.P.

(57) ABSTRACT

A current sensor configured to measure a current value of a current flowing through each of a first conductor, a second conductor, and a third conductor, the current sensor comprising: first to third magnetic detection units provided with detection surfaces and configured to output first to third detection result; first to third amplification factor correction units configured to correct first to third amplification factors set in advance based on an ambient temperature; first to third amplifiers configured to amplify the detection results based on the corrected amplification factors and output the amplified detection results as amplified signals; first to third influence degree correction units indicating influence degrees of the magnetic fields generated by the current flowing through the conductors; and first to third correction units configured to correct the amplified signals based on the corrected influence degrees and the amplified signals.

3 Claims, 3 Drawing Sheets

CURRENT FLOWING THROUGH EACH CONDUCTOR

DETECTION RESULT OF EACH MAGNETIC DETECTION UNIT

CORRECTED CURRENT FLOWING THROUGH EACH CONDUCTOR

CURRENT SENSOR

CROSS REFERENCE TO RELATED APPLICATIONS

This application is based on and claims priority under 35 U.S.C. § 119 to Japanese Patent Application 2020-132252, filed on Aug. 4, 2020, the entire content of which is incorporated herein by reference.

TECHNICAL FIELD

This disclosure relates to a current sensor which measures a current value of a current flowing through each of a plurality of conductors.

BACKGROUND DISCUSSION

In the related art, a current sensor which measures a current value of a current flowing through each of a plurality of conductors is used. As such a current sensor, there is a current sensor in which a magnetic flux density of a magnetic field generated around the conductor according to the current flowing through the conductor is detected with a magnetic detection element, and the current applied to the conductor is calculated and obtained based on the detected magnetic flux density. As such a current sensor, for example, there are those described in JP 2019-100923A and WO 2013/011859 (References 1 and 2) to be listed below.

In the current sensor described in Reference 1, three magnetic detection elements are disposed so as to face three conductors, respectively. The three conductors and the three magnetic detection elements are disposed with their positions and angles adjusted, thereby reducing mutual interference among the three conductors.

In the current sensor described in Reference 2, two magnetic sensors are disposed with respect to one conductor, and the respective magnetic sensors are disposed such that distances from the conductor are substantially equal and sensitivity axes thereof are oriented in substantially the same direction. By taking a difference between outputs of the two magnetic sensors, an influence of an external magnetic field is reduced, and offsets of the outputs of the two magnetic sensors are canceled to reduce an influence of the offsets.

Techniques described in References 1 and 2 are compact and low-cost without using a core which collects a magnetic flux of the magnetic field generated around the conductor. However, in order to reduce the influence of the magnetic field generated around the conductor, it is necessary to dispose the magnetic detection elements in consideration of the position, the angle, the distance, and the like, and a current sensor cannot be easily configured due to restrictions on the arrangement.

A need thus exists for a current sensor which is not susceptible to the drawback mentioned above.

SUMMARY

A characteristic configuration of a current sensor according to this disclosure resides in that the current sensor is configured to measure a current value of a current flowing through each of a first conductor, a second conductor, and a third conductor, and includes: a first magnetic detection unit provided with a detection surface which is disposed so as to be orthogonal to a magnetic force line of a magnetic field generated by the current flowing through the first conductor and detects a magnetic flux density on a first conductor side of the second conductor and the third conductor, and configured to output a first detection result as a detection result of the magnetic flux density; a second magnetic detection unit provided with a detection surface which is disposed so as to be orthogonal to a magnetic force line of a magnetic field generated by the current flowing through the second conductor and detects a magnetic flux density on a second conductor side of the first conductor and the third conductor, and configured to output a second detection result as a detection result of the magnetic flux density; a third magnetic detection unit provided with a detection surface which is disposed so as to be orthogonal to a magnetic force line of a magnetic field generated by the current flowing through the third conductor and detects a magnetic flux density on a third conductor side of the first conductor and the second conductor, and configured to output a third detection result as a detection result of the magnetic flux density; a first amplification factor correction unit configured to correct a first amplification factor set in advance based on an ambient temperature; a second amplification factor correction unit configured to correct a second amplification factor set in advance based on the temperature; a third amplification factor correction unit configured to correct a third amplification factor set in advance based on the temperature; a first amplifier configured to amplify the first detection result based on the corrected first amplification factor and output the amplified first detection result as a first amplified signal; a second amplifier configured to amplify the second detection result based on the corrected second amplification factor and output the amplified second detection result as a second amplified signal; a third amplifier configured to amplify the third detection result based on the corrected third amplification factor and output the amplified third detection result as a third amplified signal; a first influence degree correction unit indicating an influence degree of the magnetic field generated by the current flowing through each of the second conductor and the third conductor with respect to the first detection result and configured to correct a first influence degree set in advance; a second influence degree correction unit indicating an influence degree of the magnetic field generated by the current flowing through each of the first conductor and the third conductor with respect to the second detection result and configured to correct a second influence degree set in advance; a third influence degree correction unit indicating an influence degree of the magnetic field generated by the current flowing through each of the first conductor and the second conductor with respect to the third detection result and configured to correct a third influence degree set in advance; a first correction unit configured to correct the first amplified signal based on the corrected first influence degree, the second amplified signal, and the third amplified signal; a second correction unit configured to correct the second amplified signal based on the corrected second influence degree, the first amplified signal, and the third amplified signal; and a third correction unit configured to correct the third amplified signal based on the corrected third influence degree, the first amplified signal, and the second amplified signal.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

A current sensor disclosed here is configured to be compact without using a core and to be capable of reducing an influence of a magnetic field generated around a conductor. Hereinafter, a current sensor 1 of the present embodiment will be described. Here, when a current flows through the conductor, the magnetic field is generated with the conductor as an axial center according to a magnitude of the current (Ampere's right-handed screw rule). The present current sensor 1 detects a magnetic flux density of a magnetic flux in such a magnetic field, and measures a current value of a current flowing through each of a first conductor 2A, a second conductor 2B, and a third conductor 2C based on the detected magnetic flux density.

Figure 1:
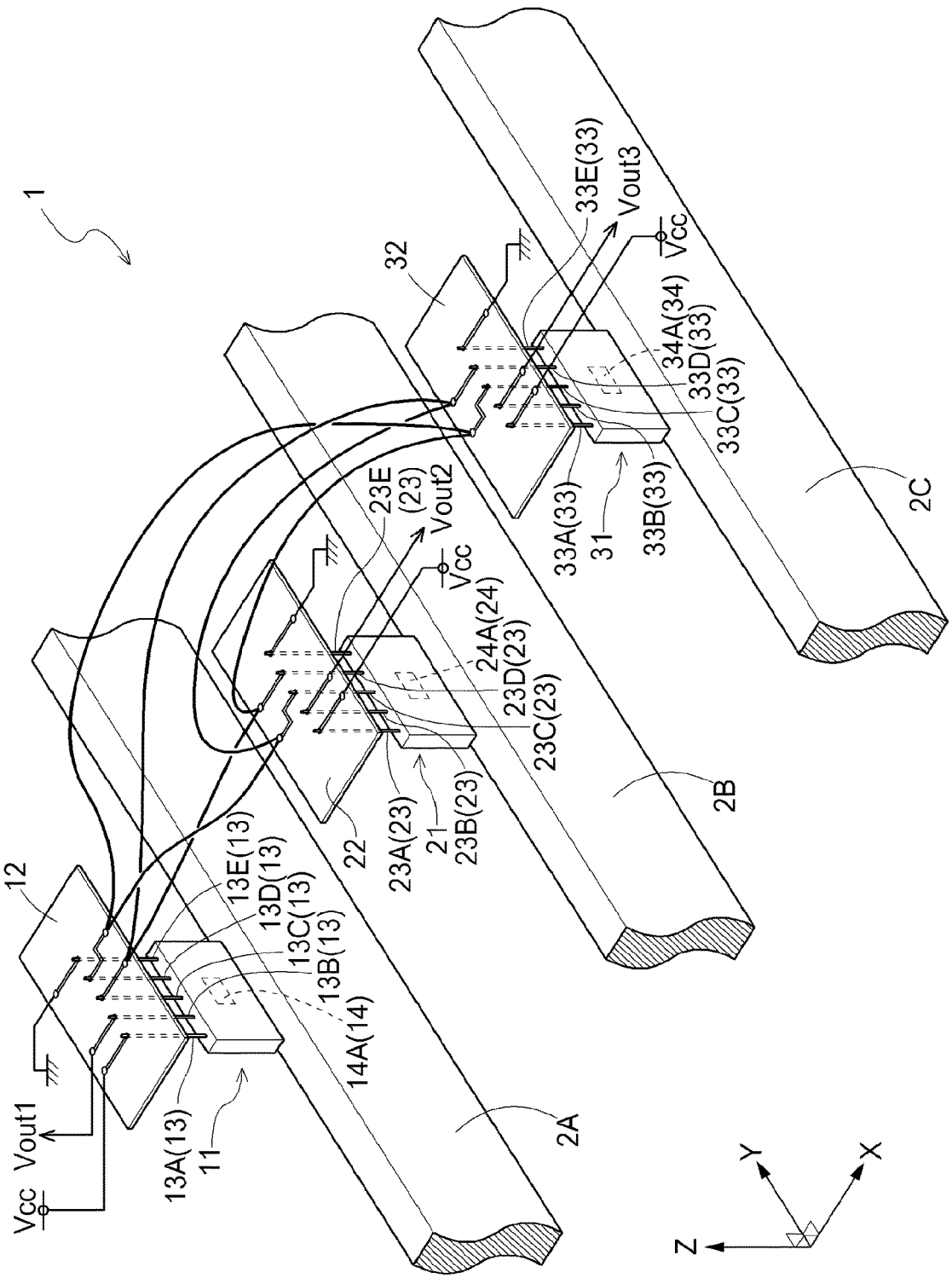
FIG. 1 is an arrangement diagram of a current sensor with respect to a conductor.

FIG. 1 is an arrangement diagram of the current sensor 1 with respect to the first conductor 2A, the second conductor 2B, and the third conductor 2C. The first conductor 2A, the second conductor 2B, and the third conductor 2C correspond to three bus bars connected to, for example, a three-phase motor. More specifically, the first conductor 2A, the second conductor 2B, and the third conductor 2C electrically connect each of three terminals of the three-phase motor to each of three terminals of an inverter which controls a current flowing through the three-phase motor.

In the present embodiment, the first conductor 2A, the second conductor 2B, and the third conductor 2C extend along a second direction orthogonal to a first direction which is an adjacent direction in which the first conductor 2A, the second conductor 2B, and the third conductor 2C are adjacent to each other. The adjacent direction in which the first conductor 2A, the second conductor 2B, and the third conductor 2C are adjacent to each other corresponds to an X direction in FIG. 1, and the second direction orthogonal to the first direction corresponds to a Y direction in FIG. 1. Therefore, the first conductor 2A, the second conductor 2B, and the third conductor 2C are provided such that their axial centers are parallel to each other. Further, a direction orthogonal to both the first direction and the second direction will be described as a third direction (Z direction). In the present embodiment, the first conductor 2A and a first magnetic detection unit 14 to be described later are disposed along the third direction, the second conductor 2B and a second magnetic detection unit 24 to be described later are disposed along the third direction, and the third conductor 2C and a third magnetic detection unit 34 to be described later are disposed along the third direction.

The current sensor 1 includes a first magnetoelectric conversion unit 11, a second magnetoelectric conversion unit 21, and a third magnetoelectric conversion unit 31. The first magnetoelectric conversion unit 11, the second magnetoelectric conversion unit 21, and the third magnetoelectric conversion unit 31 are configured to output an electric signal according to the magnetic flux density of the input magnetic flux. The first magnetoelectric conversion unit 11 includes five terminals 13, and the second magnetoelectric conversion unit 21 includes five terminals 23. The third magnetoelectric conversion unit 31 includes five terminals 33. In the present embodiment, the first magnetoelectric conversion unit 11 is mounted on a first substrate 12 via the five terminals 13, the second magnetoelectric conversion unit 21 is mounted on a second substrate 22 via the five terminals 23, and the third magnetoelectric conversion unit 31 is mounted on a third substrate 32 via the five terminals 33.

The five terminals 13 of the first magnetoelectric conversion unit 11 include a power supply terminal 13A to which a power supply voltage Vcc is applied, an output terminal 13B from which an output Vout1 as the first magnetoelectric conversion unit 11 is output, a first amplified signal output terminal 13C from which a first amplified signal to be described later is output, a first amplified signal input terminal 13D to which a second amplified signal and a third amplified signal to be described later are input, and a reference terminal 13E to which a reference potential is set. The five terminals 23 of the second magnetoelectric conversion unit 21 include a power supply terminal 23A to which the power supply voltage Vcc is applied, an output terminal 23B from which an output Vout2 as the second magnetoelectric conversion unit 21 is output, a second amplified signal output terminal 23C from which the second amplified signal to be described later is output, a second amplified signal input terminal 23D to which the first amplified signal and the third amplified signal to be described later are input, and a reference terminal 23E to which the reference potential is set. The five terminals 33 of the third magnetoelectric conversion unit 31 include a power supply terminal 33A to which the power supply voltage Vcc is applied, an output terminal 33B from which an output Vout3 as the third magnetoelectric conversion unit 31 is output, a third amplified signal output terminal 33C from which the third amplified signal to be described later is output, a third amplified signal input terminal 33D to which the first amplified signal and the second amplified signal to be described later are input, and a reference terminal 33E to which the reference potential is set.

Figure 2:
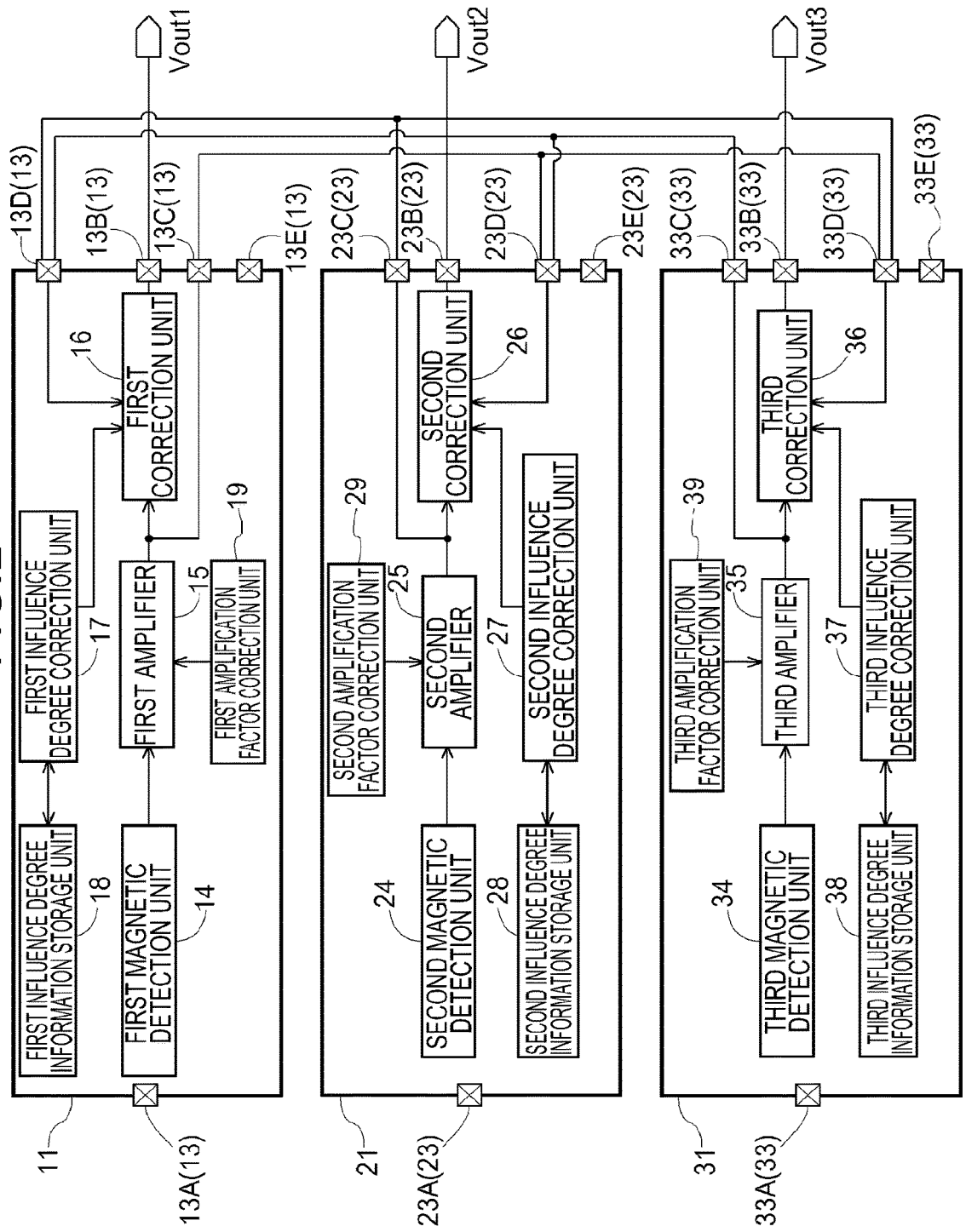
FIG. 2 is a block diagram illustrating a configuration of the current sensor.

FIG. 2 is a block diagram illustrating configurations of the first magnetoelectric conversion unit 11, the second magnetoelectric conversion unit 21, and the third magnetoelectric conversion unit 31. As shown in FIG. 2, the first magnetoelectric conversion unit 11 includes functional units of the first magnetic detection unit 14, a first amplifier 15, a first correction unit 16, a first influence degree correction unit 17, a first influence degree information storage unit 18, and a first amplification factor correction unit 19, and the second magnetoelectric conversion unit 21 includes functional units of a second magnetic detection unit 24, a second amplifier 25, a second correction unit 26, a second influence degree correction unit 27, a second influence degree information storage unit 28, and a second amplification factor correction unit 29. Further, the third magnetoelectric conversion unit 31 includes functional units of the third magnetic detection unit 34, a third amplifier 35, a third correction unit 36, a third influence degree correction unit 37, a third influence degree information storage unit 38, and a third amplification factor correction unit 39. Each functional unit is configured by hardware, software, or both of hardware and software using a CPU as a core member in order to perform processing related to the detection of the magnetic flux density.

As illustrated in FIG. 1, the first magnetic detection unit 14 is provided with a detection surface 14A which is disposed so as to be orthogonal to a magnetic force line of a magnetic field generated by the current flowing through the first conductor 2A and detects a magnetic flux density on a first conductor 2A side of the second conductor 2B and the third conductor 2C. An expression "on the first conductor 2A side of the second conductor 2B and the third conductor 2C" means that a distance from the first magnetic detection unit 14 to the first conductor 2A is shorter than a distance from the first magnetic detection unit 14 to the second conductor 2B and the third conductor 2C. The magnetic force line of the magnetic field generated by the current flowing through the first conductor 2A refers to the magnetic force line of the magnetic field generated around the first conductor 2A by the current flowing through the first conductor 2A. The detection surface 14A which detects the magnetic flux density is a surface which receives the magnetic flux detected by the first magnetic detection unit 14, and is provided such that the magnetic force line is input vertically. In the present embodiment, the detection surface 14A is a surface orthogonal to the first direction. Therefore, the first magnetic detection unit 14 is disposed at a position where the distance to the first conductor 2A is shorter than the distance to the second conductor 2B and the third conductor 2C, and is provided such that the magnetic force line of the magnetic field generated around the first conductor 2A by the current flowing through the first conductor 2A is input perpendicular to the detection surface 14A of the first magnetic detection unit 14.

The first magnetic detection unit 14 outputs a first detection result as a detection result of the magnetic flux density. The first magnetic detection unit 14 outputs an electric signal as the detection result according to the detected magnetic flux density, and the electric signal is referred to as the first detection result in the present embodiment. As illustrated in FIG. 2, the first detection result is transmitted to the first amplifier 15, which will be described later.

As illustrated in FIG. 1, the second magnetic detection unit 24 is provided with a detection surface 24A which is disposed so as to be orthogonal to a magnetic force line of a magnetic field generated by the current flowing through the second conductor 2B and detects a magnetic flux density on a second conductor 2B side of the first conductor 2A and the third conductor 2C. An expression "on the second conductor 2B side of the first conductor 2A and the third conductor 2C" means that a distance from the second magnetic detection unit 24 to the second conductor 2B is shorter than a distance from the second magnetic detection unit 24 to the first conductor 2A and the third conductor 2C. The magnetic force line of the magnetic field generated by the current flowing through the second conductor 2B refers to the magnetic force line of the magnetic field generated around the second conductor 2B by the current flowing through the second conductor 2B. The detection surface 24A which detects the magnetic flux density is a surface which receives the magnetic flux detected by the second magnetic detection unit 24, and is provided such that the magnetic force line is input vertically. In the present embodiment, the detection surface 24A is a surface orthogonal to the first direction. Therefore, the second magnetic detection unit 24 is disposed at a position where the distance to the second conductor 2B is shorter than the distance to the first conductor 2A and the third conductor 2C, and is provided such that the magnetic force line of the magnetic field generated around the second conductor 2B by the current flowing through the second conductor 2B is input perpendicular to the detection surface 24A of the second magnetic detection unit 24.

The second magnetic detection unit 24 outputs a second detection result as a detection result of the magnetic flux density. The second magnetic detection unit 24 outputs an electric signal as the detection result according to the detected magnetic flux density, and the electric signal is referred to as the second detection result in the present embodiment. As illustrated in FIG. 2, the second detection result is transmitted to the second amplifier 25, which will be described later.

As illustrated in FIG. 1, the third magnetic detection unit 34 is provided with a detection surface 34A which is disposed so as to be orthogonal to a magnetic force line of a magnetic field generated by the current flowing through the third conductor 2C and detects a magnetic flux density on a third conductor 2C side of the first conductor 2A and the second conductor 2B. An expression "on the third conductor 2C side of the first conductor 2A and the second conductor 2B" means that a distance from the third magnetic detection unit 34 to the third conductor 2C is shorter than a distance from the third magnetic detection unit 34 to the first conductor 2A and the second conductor 2B. The magnetic force line of the magnetic field generated by the current flowing through the third conductor 2C refers to the magnetic force line of the magnetic field generated around the third conductor 2C by the current flowing through the third conductor 2C. The detection surface 34A which detects the magnetic flux density is a surface which receives the magnetic flux detected by the third magnetic detection unit 34, and is provided such that the magnetic force line is input vertically. In the present embodiment, the detection surface 34A is a surface orthogonal to the first direction. Therefore, the third magnetic detection unit 34 is disposed at a position where the distance to the third conductor 2C is shorter than the distance to the first conductor 2A and the second conductor 2B, and is provided such that the magnetic force line of the magnetic field generated around the third conductor 2C by the current flowing through the third conductor 2C is input perpendicular to the detection surface 34A of the third magnetic detection unit 34.

The third magnetic detection unit 34 outputs a third detection result as a detection result of the magnetic flux density. The third magnetic detection unit 34 outputs an electric signal as the detection result according to the detected magnetic flux density, and the electric signal is referred to as the third detection result in the present embodiment. As illustrated in FIG. 2, the third detection result is transmitted to the third amplifier 35, which will be described later.

The first amplification factor correction unit 19 corrects a first amplification factor set in advance based on an ambient temperature. The ambient temperature is an ambient temperature of the first magnetic detection unit 14. Such an ambient temperature may be detected by, for example, a temperature detection element included in the first amplification factor correction unit 19, or a detection result of a temperature detection element (not illustrated) provided separately from the first amplification factor correction unit 19 may be acquired. The first amplification factor set in advance is an amplification factor by which the first amplifier 15 to be described later amplifies the first detection result which is the detection result of the first magnetic detection unit 14, and is set in advance for the first amplifier 15. Therefore, the first amplification factor correction unit 19 corrects, based on the ambient temperature of the first magnetic detection unit 14, the amplification factor which is set in advance for the first amplifier 15 and by which the first amplifier 15 amplifies the first detection result which is the detection result of the first magnetic detection unit 14. In other words, the first amplification factor correction unit 19 performs, based on the ambient temperature of the first magnetic detection unit 14, temperature compensation on the amplification factor used when the first amplifier 15 amplifies the first detection result which is the detection result of the first magnetic detection unit 14.

The second amplification factor correction unit 29 corrects a second amplification factor set in advance based on an ambient temperature. The ambient temperature is an ambient temperature of the second magnetic detection unit 24. Such an ambient temperature may be detected by, for example, a temperature detection element included in the second amplification factor correction unit 29, or a detection result of a temperature detection element (not illustrated) provided separately from the second amplification factor correction unit 29 may be acquired. The second amplification factor set in advance is an amplification factor by which the second amplifier 25 to be described later amplifies the second detection result which is the detection result of the second magnetic detection unit 24, and is set in advance for the second amplifier 25. Therefore, the second amplification factor correction unit 29 corrects, based on the ambient temperature of the second magnetic detection unit 24, the amplification factor which is set in advance for the second amplifier 25 and by which the second amplifier 25 amplifies the second detection result which is the detection result of the second magnetic detection unit 24. In other words, the second amplification factor correction unit 29 performs, based on the ambient temperature of the second magnetic detection unit 24, temperature compensation on the amplification factor used when the second amplifier 25 amplifies the second detection result which is the detection result of the second magnetic detection unit 24.

The third amplification factor correction unit 39 corrects a third amplification factor set in advance based on an ambient temperature. The ambient temperature is an ambient temperature of the third magnetic detection unit 34. Such an ambient temperature may be detected by, for example, a temperature detection element included in the third amplification factor correction unit 39, or a detection result of a temperature detection element (not illustrated) provided separately from the third amplification factor correction unit 39 may be acquired. The third amplification factor set in advance is an amplification factor by which the third amplifier 35 to be described later amplifies the third detection result which is the detection result of the third magnetic detection unit 34, and is set in advance for the third amplifier 35. Therefore, the third amplification factor correction unit 39 corrects, based on the ambient temperature of the third magnetic detection unit 34, the amplification factor which is set in advance for the third amplifier 35 and by which the third amplifier 35 amplifies the third detection result which is the detection result of the third magnetic detection unit 34. In other words, the third amplification factor correction unit 39 performs, based on the ambient temperature of the third magnetic detection unit 34, temperature compensation on the amplification factor used when the third amplifier 35 amplifies the third detection result which is the detection result of the third magnetic detection unit 34.

The first amplifier 15 amplifies the first detection result based on the corrected first amplification factor, and outputs the first detection result as the first amplified signal. The corrected first amplification factor is the amplification factor corrected by the first amplification factor correction unit 19. The first detection result is transmitted from the first magnetic detection unit 14 to the first amplifier 15, and the first detection result is amplified by the corrected first amplification factor. The first detection result amplified in this way is transmitted from the first amplifier 15 to the first correction unit 16 to be described later as the first amplified signal, is input to the second magnetoelectric conversion unit 21 via the first amplified signal output terminal 13C and the second amplified signal input terminal 23D, and is input to the third magnetoelectric conversion unit 31 via the first amplified signal output terminal 13C and the third amplified signal input terminal 33D.

The second amplifier 25 amplifies the second detection result based on the corrected second amplification factor, and outputs the second detection result as the second amplified signal. The corrected second amplification factor is the amplification factor corrected by the second amplification factor correction unit 29. The second detection result is transmitted from the second magnetic detection unit 24 to the second amplifier 25, and the second detection result is amplified by the corrected second amplification factor. The second detection result amplified in this way is transmitted from the second amplifier 25 to the second correction unit 26 to be described later as the second amplified signal, is input to the first magnetoelectric conversion unit 11 via the second amplified signal output terminal 23C and the first amplified signal input terminal 13D, and is input to the third magnetoelectric conversion unit 31 via the second amplified signal output terminal 23C and the third amplified signal input terminal 33D.

The third amplifier 35 amplifies the third detection result based on the corrected third amplification factor, and outputs the third detection result as the third amplified signal. The corrected third amplification factor is the amplification factor corrected by the third amplification factor correction unit 39. The third detection result is transmitted from the third magnetic detection unit 34 to the third amplifier 35, and the third detection result is amplified by the corrected third amplification factor. The third detection result amplified in this way is transmitted from the third amplifier 35 to the third correction unit 36 to be described later as the third amplified signal, is input to the first magnetoelectric conversion unit 11 via the third amplified signal output terminal 33C and the first amplified signal input terminal 13D, and is input to the second magnetoelectric conversion unit 21 via the third amplified signal output terminal 33C and the second amplified signal input terminal 23D.

The first influence degree correction unit 17 corrects a first influence degree set in advance. The first influence degree is a parameter indicating an influence degree of the magnetic field generated by the current flowing through each of the second conductor 2B and the third conductor 2C on the first detection result, and in the present embodiment, is stored in advance in the first influence degree information storage unit 18.

Specifically, the first influence degree is an index indicating the influence of the magnetic fields which are input to the first magnetic detection unit 14 when the currents flow through the second conductor 2B and the third conductor 2C at the same time as the first conductor 2A and generated by the currents flowing through the second conductor 2B and the third conductor 2C on the first detection result when the current flows only through the first conductor 2A. The first detection result when the current flows only through the first conductor 2A is the detection result of the magnetic flux density by the first magnetic detection unit 14 in a state in which no current flows through the second conductor 2B and the third conductor 2C and in a state in which the current flows through the first conductor 2A. That is, the first influence degree corresponds to the detection result of the magnetic flux density by the first magnetic detection unit 14 in the state in which there is no influence of the currents flowing through the second conductor 2B and the third conductor 2C. In contrast, the case where the currents also flow through the second conductor 2B and the third conductor 2C at the same time as the first conductor 2A is a state in which the currents flows through the first conductor 2A, the second conductor 2B, and the third conductor 2C. Therefore, in this state, the magnetic field generated by the current flowing through the first conductor 2A, the magnetic field generated by the current flowing through the second conductor 2B, and the magnetic field generated by the current flowing through the third conductor 2C are input to the first magnetic detection unit 14. Therefore, the detection result of the magnetic flux density by the first magnetic detection unit 14 includes not only the magnetic flux density based on the magnetic field generated by the current flowing through the first conductor 2A but also the magnetic flux density based on the magnetic field generated by the current flowing through the second conductor 2B and the magnetic flux density based on the magnetic field generated by the current flowing through the third conductor 2C. The first influence degree corresponds to a parameter indicating degrees of the magnetic flux density based on the magnetic field generated by the current flowing through the second conductor 2B and the magnetic flux density based on the magnetic field generated by the current flowing through the third conductor 2C included in the detection result of the magnetic flux density by the first magnetic detection unit 14.

For example, the first influence degree can be defined based on an interval between the first conductor 2A and the second conductor 2B, an interval between the first conductor 2A and the third conductor 2C, a position of the axial center of the second conductor 2B as viewed from the axial center of the first conductor 2A, and a position of the axial center of the third conductor 2C as viewed from the axial center of the first conductor 2A. That is, the first influence degree is set according to the distance from the first conductor 2A to each of the second conductor 2B and the third conductor 2C and a direction of each of the second conductor 2B and the third conductor 2C based on the first conductor 2A.

For example, the first influence degree correction unit 17 corrects the first influence degree based on a distance between the first conductor 2A and the first magnetic detection unit 14 (the detection surface 14A of the first magnetic detection unit 14). Specifically, the first influence degree correction unit 17 may correct the first influence degree so as to define the first influence degree based on a distance from the first magnetic detection unit 14 (the detection surface 14A of the first magnetic detection unit 14) to the second conductor 2B, a distance from the first magnetic detection unit 14 (the detection surface 14A of the first magnetic detection unit 14) to the third conductor 2C, the position (direction) of the axial center of the second conductor 2B on an XZ plane as viewed from the first magnetic detection unit 14 (the detection surface 14A of the first magnetic detection unit 14), and the position (direction) of the axial center of the third conductor 2C on the XZ plane as viewed from the first magnetic detection unit 14 (the detection surface 14A of the first magnetic detection unit 14).

The second influence degree correction unit 27 corrects a second influence degree set in advance. The second influence degree is a parameter indicating an influence degree of the magnetic field generated by the current flowing through each of the first conductor 2A and the third conductor 2C on the second detection result, and in the present embodiment, is stored in advance in the second influence degree information storage unit 28.

Specifically, the second influence degree is an index indicating the influence of the magnetic fields which are input to the second magnetic detection unit 24 when the currents flow through the first conductor 2A and the third conductor 2C at the same time as the second conductor 2B and generated by the currents flowing through the first conductor 2A and the third conductor 2C on the second detection result when the current flows only through the second conductor 2B. The second detection result when the current flows only through the second conductor 2B is the detection result of the magnetic flux density by the second magnetic detection unit 24 in a state in which no current flows through the first conductor 2A and the third conductor 2C and in a state in which the current flows through the second conductor 2B. That is, the second influence degree corresponds to the detection result of the magnetic flux density by the second magnetic detection unit 24 in the state in which there is no influence of the currents flowing through the first conductor 2A and the third conductor 2C. In contrast, the case where the currents also flow through the first conductor 2A and the third conductor 2C at the same time as the second conductor 2B is a state in which the currents flows through the first conductor 2A, the second conductor 2B, and the third conductor 2C. Therefore, in this state, the magnetic field generated by the current flowing through the first conductor 2A, the magnetic field generated by the current flowing through the second conductor 2B, and the magnetic field generated by the current flowing through the third conductor 2C are input to the second magnetic detection unit 24. Therefore, the detection result of the magnetic flux density by the second magnetic detection unit 24 includes not only the magnetic flux density based on the magnetic field generated by the current flowing through the second conductor 2B but also the magnetic flux density based on the magnetic field generated by the current flowing through the first conductor 2A and the magnetic flux density based on the magnetic field generated by the current flowing through the third conductor 2C. The second influence degree corresponds to a parameter indicating degrees of the magnetic flux density based on the magnetic field generated by the current flowing through the first conductor 2A and the magnetic flux density based on the magnetic field generated by the current flowing through the third conductor 2C included in the detection result of the magnetic flux density by the second magnetic detection unit 24.

For example, the second influence degree can be defined based on the interval between the first conductor 2A and the second conductor 2B, an interval between the second conductor 2B and the third conductor 2C, a position of the axial center of the first conductor 2A as viewed from the axial center of the second conductor 2B, and a position of the axial center of the third conductor 2C as viewed from the axial center of the second conductor 2B. That is, the second influence degree is set according to the distance from the second conductor 2B to each of the first conductor 2A and the third conductor 2C and a direction of each of the first conductor 2A and the third conductor 2C based on the second conductor 2B.

For example, the second influence degree correction unit 27 corrects the second influence degree based on a distance between the second conductor 2B and the second magnetic detection unit 24 (the detection surface 24A of the second magnetic detection unit 24). Specifically, the second influence degree correction unit 27 may correct the second influence degree so as to define the second influence degree based on a distance from the second magnetic detection unit 24 (the detection surface 24A of the second magnetic detection unit 24) to the first conductor 2A, a distance from the second magnetic detection unit 24 (the detection surface 24A of the second magnetic detection unit 24) to the third conductor 2C, the position (direction) of the axial center of the first conductor 2A on the XZ plane as viewed from the second magnetic detection unit 24 (the detection surface 24A of the second magnetic detection unit 24), and the position (direction) of the axial center of the third conductor 2C on the XZ plane as viewed from the second magnetic detection unit 24 (the detection surface 24A of the second magnetic detection unit 24).

The third influence degree correction unit 37 corrects a third influence degree set in advance. The third influence degree is a parameter indicating an influence degree of the magnetic field generated by the current flowing through each of the first conductor 2A and the second conductor 2B on the third detection result, and in the present embodiment, is stored in advance in the third influence degree information storage unit 38.

Specifically, the third influence degree is an index indicating the influence of the magnetic fields which are input to the third magnetic detection unit 34 when the currents flow through the first conductor 2A and the second conductor 2B at the same time as the third conductor 2C and generated by the currents flowing through the first conductor 2A and the second conductor 2B on the third detection result when the current flows only through the third conductor 2C. The third detection result when the current flows only through the third conductor 2C is the detection result of the magnetic flux density by the third magnetic detection unit 34 in a state in which no current flows through the first conductor 2A and the second conductor 2B and in a state in which the current flows through the third conductor 2C. That is, the third influence degree corresponds to the detection result of the magnetic flux density by the third magnetic detection unit 34 in the state in which there is no influence of the currents flowing through the first conductor 2A and the second conductor 2B. In contrast, the case where the currents flow through the first conductor 2A and the second conductor 2B at the same time as the third conductor 2C is a state in which the currents flow through the first conductor 2A, the second conductor 2B, and the third conductor 2C. Therefore, in this state, the magnetic field generated by the current flowing through the first conductor 2A, the magnetic field generated by the current flowing through the second conductor 2B, and the magnetic field generated by the current flowing through the third conductor 2C are input to the third magnetic detection unit 34. Therefore, the detection result of the magnetic flux density by the third magnetic detection unit 34 includes not only the magnetic flux density based on the magnetic field generated by the current flowing through the third conductor 2C but also the magnetic flux density based on the magnetic field generated by the current flowing through the first conductor 2A and the magnetic flux density based on the magnetic field generated by the current flowing through the second conductor 2B. The third influence degree corresponds to a parameter indicating degrees of the magnetic flux density based on the magnetic field generated by the current flowing through the first conductor 2A and the magnetic flux density based on the magnetic field generated by the current flowing through the second conductor 2B included in the detection result of the magnetic flux density by the third magnetic detection unit 34.

For example, the third influence degree can be defined based on the interval between the first conductor 2A and the third conductor 2C, the interval between the second conductor 2B and the third conductor 2C, a position of the axial center of the first conductor 2A as viewed from the axial center of the third conductor 2C, and a position of the axial center of the second conductor 2B as viewed from the axial center of the third conductor 2C. That is, the third influence degree is set according to the distance from the third conductor 2C to each of the first conductor 2A and the second conductor 2B and a direction of each of the first conductor 2A and the second conductor 2B based on the third conductor 2C.

For example, the third influence degree correction unit 37 corrects the third influence degree based on a distance between the third conductor 2C and the third magnetic detection unit 34 (the detection surface 34A of the third magnetic detection unit 34). Specifically, the third influence degree correction unit 37 may correct the third influence degree so as to define the third influence degree based on a distance from the third magnetic detection unit 34 (the detection surface 34A of the third magnetic detection unit 34) to the first conductor 2A, a distance from the third magnetic detection unit 34 (the detection surface 34A of the third magnetic detection unit 34) to the second conductor 2B, the position (direction) of the axial center of the first conductor 2A on the XZ plane as viewed from the third magnetic detection unit 34 (the detection surface 34A of the third magnetic detection unit 34), and the position (direction) of the axial center of the second conductor 2B on the XZ plane as viewed from the third magnetic detection unit 34 (the detection surface 34A of the third magnetic detection unit 34).

The first correction unit 16 corrects the first amplified signal based on the corrected first influence degree, the second amplified signal, and the third amplified signal. The corrected first influence degree is transmitted from the first influence degree correction unit 17. The second amplified signal is output from the second amplifier 25 and transmitted to the first correction unit 16 via the second amplified signal output terminal 23C and the first amplified signal input terminal 13D. The third amplified signal is output from the third amplifier 35 and transmitted to the first correction unit 16 via the third amplified signal output terminal 33C and the first amplified signal input terminal 13D. Further, the first amplified signal is transmitted from the first amplifier 15 to the first correction unit 16. Therefore, the first correction unit 16 corrects the first amplified signal transmitted from the first amplifier 15 based on the first influence degree transmitted from the first influence degree correction unit 17, the second amplified signal transmitted to the first correction unit 16 via the second amplified signal output terminal 23C and the first amplified signal input terminal 13D, and the third amplified signal transmitted to the first correction unit 16 via the third amplified signal output terminal 33C and the first amplified signal input terminal 13D.

The second correction unit 26 corrects the second amplified signal based on the corrected second influence degree, the first amplified signal, and the third amplified signal. The corrected second influence degree is transmitted from the second influence degree correction unit 27. The first amplified signal is output from the first amplifier 15 and transmitted to the second correction unit 26 via the first amplified signal output terminal 13C and the second amplified signal input terminal 23D. The third amplified signal is output from the third amplifier 35 and transmitted to the second correction unit 26 via the third amplified signal output terminal 33C and the second amplified signal input terminal 23D. Further, the second amplified signal is transmitted from the second amplifier 25 to the second correction unit 26. Therefore, the second correction unit 26 corrects the second amplified signal transmitted from the second amplifier 25 based on the second influence degree transmitted from the second influence degree correction unit 27, the first amplified signal transmitted to the second correction unit 26 via the first amplified signal output terminal 13C and the second amplified signal input terminal 23D, and the third amplified signal transmitted to the second correction unit 26 via the third amplified signal output terminal 33C and the second amplified signal input terminal 23D.

The third correction unit 36 corrects the third amplified signal based on the corrected third influence degree, the first amplified signal, and the second amplified signal. The corrected third influence degree is transmitted from the third influence degree correction unit 37. The first amplified signal is output from the first amplifier 15 and transmitted to the third correction unit 36 via the first amplified signal output terminal 13C and the third amplified signal input terminal 33D. The second amplified signal is output from the second amplifier 25 and transmitted to the third correction unit 36 via the second amplified signal output terminal 23C and the third amplified signal input terminal 33D. Further, the third amplified signal is transmitted from the third amplifier 35 to the third correction unit 36. Therefore, the third correction unit 36 corrects the third amplified signal transmitted from the third amplifier 35 based on the third influence degree transmitted from the third influence degree correction unit 37, the first amplified signal transmitted to the third correction unit 36 via the first amplified signal output terminal 13C and the third amplified signal input terminal 33D, and the second amplified signal transmitted to the third correction unit 36 via the second amplified signal output terminal 23C and the third amplified signal input terminal 33D.

With the above configuration, the first amplifier 15 can amplify the first detection result with the temperature-compensated first amplification factor, and the detection result corrected by the first correction unit 16 so as to eliminate the influence of the magnetic field generated by the current flowing through the second conductor 2B and the magnetic field generated by the current flowing through the third conductor 2C based on the first amplified signal can be output from the first magnetoelectric conversion unit 11. The second amplifier 25 can amplify the second detection result with the temperature-compensated second amplification factor, and the detection result corrected by the second correction unit 26 so as to eliminate the influence of the magnetic field generated by the current flowing through the first conductor 2A and the magnetic field generated by the current flowing through the third conductor 2C based on the second amplified signal can be output from the second magnetoelectric conversion unit 21. Further, the third amplifier 35 can amplify the third detection result with the temperature-compensated third amplification factor, and the detection result corrected by the third correction unit 36 so as to eliminate the influence of the magnetic field generated by the current flowing through the first conductor 2A and the magnetic field generated by the current flowing through the second conductor 2B based on the third amplified signal can be output from the third magnetoelectric conversion unit 31. In other words, by adding a function of monitoring the magnetic field generated by the current flowing through the adjacent conductor or the conductor further adjacent to the adjacent conductor and cancelling the magnetic flux from these conductors as a disturbance noise component, the magnetic flux density can be detected with high accuracy, and the current can be detected with high accuracy.

The first magnetic detection unit 14, the second magnetic detection unit 24, and the third magnetic detection unit 34 are not formed by magnetoresistive elements (TMR, AMR, and the like), and can be formed using inexpensive Hall elements. Further, this disclosure can be implemented as a coreless current sensor which does not include a core.

Figure 3:
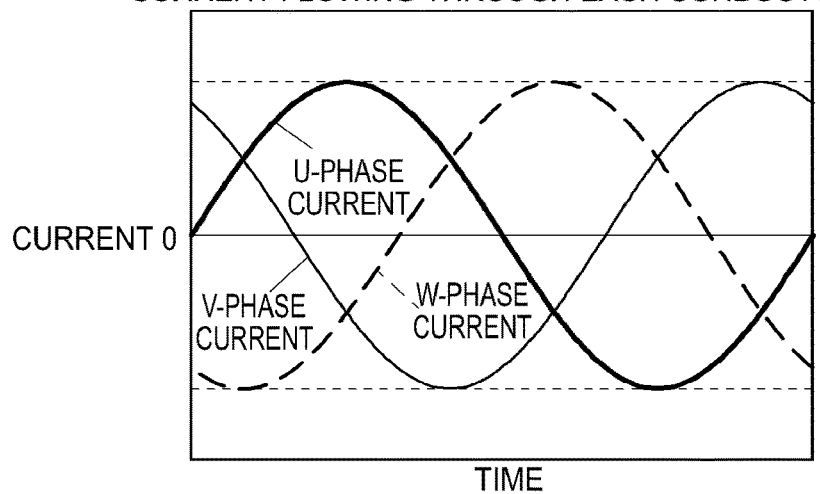
FIG. 3 is a diagram illustrating a waveform of a current flowing through each conductor.

Next, an effect of the current sensor 1 will be described with reference to diagrams illustrating an output of the current sensor 1. FIG. 3 illustrates a current waveform of the current actually flowing through the first conductor 2A, a current waveform of the current actually flowing through the second conductor 2B, and a current waveform of the current actually flowing through the third conductor 2C. In FIG. 3, the current flowing through the first conductor 2A is illustrated as a U-phase current, the current flowing through the second conductor 2B is illustrated as a V-phase current, and the current flowing through the third conductor 2C is illustrated as a W-phase current.

Figure 4:
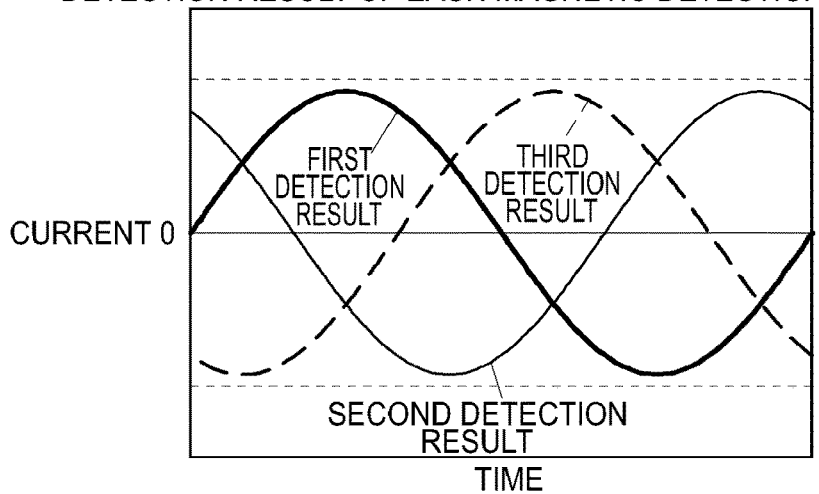
FIG. 4 is a diagram illustrating a detection result of each magnetic detection unit.

In this case, as illustrated in FIG. 4, the first detection result by the first magnetic detection unit 14 is affected by the magnetic field generated by the current flowing through the second conductor 2B and the magnetic field generated by the current flowing through the third conductor 2C, and an amplitude may decrease and a phase may shift with respect to the current waveform of the current (U-phase current) actually flowing through the first conductor 2A illustrated in FIG. 3. As illustrated in FIG. 4, the second detection result by the second magnetic detection unit 24 is affected by the magnetic field generated by the current flowing through the first conductor 2A and the magnetic field generated by the current flowing through the third conductor 2C, and an amplitude may decrease and a phase may shift with respect to the current waveform of the current (V-phase current) actually flowing through the second conductor 2B illustrated in FIG. 3. As illustrated in FIG. 4, the third detection result by the third magnetic detection unit 34 is affected by the magnetic field generated by the current flowing through the first conductor 2A and the magnetic field generated by the current flowing through the second conductor 2B, and an amplitude may decrease and a phase may shift with respect to the current waveform of the current (W-phase current) actually flowing through the third conductor 2C illustrated in FIG. 3.

In such a case, a first detection result U', a second detection result V', and a third detection result W' are expressed by the following Equation (1), where U is the current flowing through the first conductor 2A, V is the current flowing through the second conductor 2B, and W is the current flowing through the third conductor 2C.

$$\begin{pmatrix} U' \\ V' \\ W' \end{pmatrix} = \begin{pmatrix} 1 & 0.1 & 0.05 \\ 0.1 & 1 & 0.1 \\ 0.05 & 0.1 & 1 \end{pmatrix} \begin{pmatrix} U \\ V \\ W \end{pmatrix} \quad (1)$$

Here, a first term on a right side represents the influence degree described above by a matrix. Here, an influence degree from an adjacent conductor is set to 0.1, and an influence degree from every other adjacent conductor is set to 0.05. Such an influence degree may be measured at a time of design and stored in advance.

When Equation (1) is solved for U, V, and W, Equation (2) is obtained.

$$\begin{pmatrix} U \\ V \\ W \end{pmatrix} = \begin{pmatrix} 1 & 0.1 & 0.05 \\ 0.1 & 1 & 0.1 \\ 0.05 & 0.1 & 1 \end{pmatrix}^{-1} \begin{pmatrix} U' \\ V' \\ W' \end{pmatrix} \quad (2)$$

Here, a first term on a right side is an inverse matrix of the matrix related to the influence degree described above.

Figure 5:
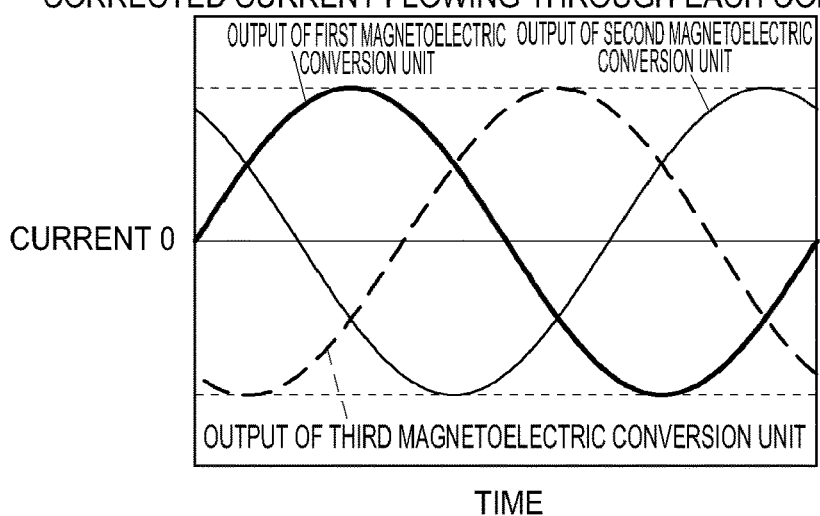
FIG. 5 is a diagram illustrating a waveform of a corrected current flowing through each conductor.

By substituting the first detection result U', the second detection result V', and the third detection result W' obtained by actual measurement into Equation (2) and performing calculation, a calculated value obtained by reducing an influence of a current flowing through another conductor can be obtained, and current values (current waveforms) of the currents as illustrated in FIG. 5 can be output from the first magnetoelectric conversion unit 11, the second magnetoelectric conversion unit 21, and the third magnetoelectric conversion unit 31.

Other Embodiments

The above-described embodiment describes an example when the first substrate 12, the second substrate 22, and the third substrate 32 are separate bodies, and the first substrate 12, the second substrate 22, and the third substrate 32 may be formed by a single substrate.

The above-described embodiment discloses that the first magnetoelectric conversion unit 11 outputs the output Vout1 as the first magnetoelectric conversion unit 11 from the output terminal 13B, and outputs a first amplified signal from the first amplified signal output terminal 13C to the second magnetoelectric conversion unit 21 and the third magnetoelectric conversion unit 31, and when high responsiveness is not essential, the output Vout1 may be output from the same terminal (for example, the output terminal 13B) at different transmission timings, and the first amplified signal may be output. The above-described embodiment discloses that the second magnetoelectric conversion unit 21 outputs the output Vout2 as the second magnetoelectric conversion unit 21 from the output terminal 23B, and outputs a second amplified signal from the second amplified signal output terminal 23C to the first magnetoelectric conversion unit 11 and the third magnetoelectric conversion unit 31, and when the high responsiveness is not essential, the output Vout2 may be output from the same terminal (for example, the output terminal 23B) at different transmission timings, and the second amplified signal may be output. Further, the third magnetoelectric conversion unit 31 outputs the output Vout3 as the third magnetoelectric conversion unit 31 from the output terminal 33B, and outputs a third amplified signal from the third amplified signal output terminal 33C to the first magnetoelectric conversion unit 11 and the second magnetoelectric conversion unit 21, and when the high responsiveness is not essential, the output Vout3 may be output from the same terminal (for example, the output terminal 33B) at different transmission timings, and the third amplified signal may be output.

The above-described embodiment discloses that the first amplified signal is corrected based on the second amplified signal and the third amplified signal in the first magnetoelectric conversion unit 11, the second amplified signal is corrected based on the first amplified signal and the third amplified signal in the second magnetoelectric conversion unit 21, and the third amplified signal is corrected based on the first amplified signal and the second amplified signal in the third magnetoelectric conversion unit 31, and detection may be performed by detecting a signal synchronized with an output variation of current consumption, a voltage, and the like of the first magnetoelectric conversion unit 11, the second magnetoelectric conversion unit 21, and the third magnetoelectric conversion unit 31 at a time of the output variation.

This disclosure can be used in a current sensor which measures a current value of a current flowing through each of a plurality of conductors.

A characteristic configuration of a current sensor according to this disclosure resides in that the current sensor is configured to measure a current value of a current flowing through each of a first conductor, a second conductor, and a third conductor, and includes: a first magnetic detection unit provided with a detection surface which is disposed so as to be orthogonal to a magnetic force line of a magnetic field generated by the current flowing through the first conductor and detects a magnetic flux density on a first conductor side of the second conductor and the third conductor, and configured to output a first detection result as a detection result of the magnetic flux density; a second magnetic detection unit provided with a detection surface which is disposed so as to be orthogonal to a magnetic force line of a magnetic field generated by the current flowing through the second conductor and detects a magnetic flux density on a second conductor side of the first conductor and the third conductor, and configured to output a second detection result as a detection result of the magnetic flux density; a third magnetic detection unit provided with a detection surface which is disposed so as to be orthogonal to a magnetic force line of a magnetic field generated by the current flowing through the third conductor and detects a magnetic flux density on a third conductor side of the first conductor and the second conductor, and configured to output a third detection result as a detection result of the magnetic flux density; a first amplification factor correction unit configured to correct a first amplification factor set in advance based on an ambient temperature; a second amplification factor correction unit configured to correct a second amplification factor set in advance based on the temperature; a third amplification factor correction unit configured to correct a third amplification factor set in advance based on the temperature; a first amplifier configured to amplify the first detection result based on the corrected first amplification factor and output the amplified first detection result as a first amplified signal; a second amplifier configured to amplify the second detection result based on the corrected second amplification factor and output the amplified second detection result as a second amplified signal; a third amplifier configured to amplify the third detection result based on the corrected third amplification factor and output the amplified third detection result as a third amplified signal; a first influence degree correction unit indicating an influence degree of the magnetic field generated by the current flowing through each of the second conductor and the third conductor with respect to the first detection result and configured to correct a first influence degree set in advance; a second influence degree correction unit indicating an influence degree of the magnetic field generated by the current flowing through each of the first conductor and the third conductor with respect to the second detection result and configured to correct a second influence degree set in advance; a third influence degree correction unit indicating an influence degree of the magnetic field generated by the current flowing through each of the first conductor and the second conductor with respect to the third detection result and configured to correct a third influence degree set in advance; a first correction unit configured to correct the first amplified signal based on the corrected first influence degree, the second amplified signal, and the third amplified signal; a second correction unit configured to correct the second amplified signal based on the corrected second influence degree, the first amplified signal, and the third amplified signal; and a third correction unit configured to correct the third amplified signal based on the corrected third influence degree, the first amplified signal, and the second amplified signal.

According to such a characteristic configuration, outputs of the second magnetic detection unit and the third magnetic detection unit can be fed back to an output of the first magnetic detection unit, the outputs of the first magnetic detection unit and the third magnetic detection unit can be fed back to the output of the second magnetic detection unit, and the outputs of the first magnetic detection unit and the second magnetic detection unit can be fed back to the output of the third magnetic detection unit for the detection. Therefore, an influence of the current flowing through each of the second conductor and the third conductor on the output of the first magnetic detection unit can be reduced, an influence of the current flowing through each of the first conductor and the third conductor on the output of the second magnetic detection unit can be reduced, and an influence of the current flowing through each of the first conductor and the second conductor on the output of the third magnetic detection unit can be reduced, and thus detection accuracy of the magnetic flux density can be improved. Since the present current sensor measures the current value of the current based on the magnetic flux density detected with the improved detection accuracy as described above, the current sensor can measure the current value with high accuracy. The current flowing through the conductor can be detected with the high accuracy without requiring a component for magnetic collection or a component for reducing disturbance (for example, a core or a shield plate). Further, since there is no need for the component for magnetic collection or the component for reducing disturbance, the current sensor can be downsized and can be implemented at low cost.

Further, it is preferable that the first influence degree is an index indicating an influence of the magnetic fields which are input to the first magnetic detection unit and generated by the currents flowing through the second conductor and the third conductor when the currents flow through the second conductor and the third conductor at the same time as the first conductor on the first detection result when the current flows only through the first conductor, the second influence degree is an index indicating an influence of the magnetic fields which are input to the second magnetic detection unit and generated by the currents flowing through the first conductor and the third conductor when the currents flow through the first conductor and the third conductor at the same time as the second conductor on the second detection result when the current flows only through the second conductor, and the third influence degree is an index indicating an influence of the magnetic fields which are input to the third magnetic detection unit and generated by the currents flowing through the first conductor and the second conductor when the currents flow through the first conductor and the second conductor at the same time as the third conductor on the third detection result when the current flows only through the third conductor.

According to such a configuration, the influence of the magnetic field generated by the current flowing through each of the second conductor and the third conductor on the first detection result can be estimated, the influence of the magnetic field generated by the current flowing through the first conductor and the third conductor on the second detection result can be estimated, and the influence of the magnetic field generated by the current flowing through the first conductor and the second conductor on the third detection result can be estimated.

Further, it is preferable that the first conductor, the second conductor, and the third conductor are provided such that axial centers of the respective conductors are parallel to each other, the first influence degree is defined based on an interval between the first conductor and the second conductor, an interval between the first conductor and the third conductor, a position of the axial center of the second conductor as viewed from the axial center of the first conductor, and a position of the axial center of the third conductor as viewed from the axial center of the first conductor, the second influence degree is defined based on the interval between the first conductor and the second conductor, an interval between the second conductor and the third conductor, a position of the axial center of the first conductor as viewed from the axial center of the second conductor, and a position of the axial center of the third conductor as viewed from the axial center of the second conductor, and the third influence degree is defined based on the interval between the first conductor and the third conductor, the interval between the second conductor and the third conductor, a position of the axial center of the first conductor as viewed from the axial center of the third conductor, and a position of the axial center of the second conductor as viewed from the axial center of the third conductor.

With such a configuration, the first influence degree, the second influence degree, and the third influence degree can be easily set. Therefore, the first correction unit, the second correction unit, and the third correction unit can appropriately correct the first amplified signal, the second amplified signal, and the third amplified signal, respectively.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A current sensor configured to measure a current value of a current flowing through each of a first conductor, a second conductor, and a third conductor, the current sensor comprising:
   a first magnetic detection unit provided with a detection surface orthogonal to a magnetic force line of a magnetic field generated by the current flowing through the first conductor that detects a magnetic flux density on a first conductor side of the second conductor and the third conductor, the first magnetic detection unit configured to output a first detection result;
   a second magnetic detection unit provided with a detection surface orthogonal to a magnetic force line of a magnetic field generated by the current flowing through the second conductor that detects a magnetic flux density on a second conductor side of the first conductor and the third conductor, the second magnetic detection unit configured to output a second detection result;
   a third magnetic detection unit provided with a detection surface orthogonal to a magnetic force line of a magnetic field generated by the current flowing through the third conductor that detects a magnetic flux density on a third conductor side of the first conductor and the second conductor, the third magnetic detection unit configured to output a third detection result;

a first amplification factor correction unit configured to correct a first amplification factor based on an ambient temperature;

a second amplification factor correction unit configured to correct a second amplification factor based on the ambient temperature;

a third amplification factor correction unit configured to correct a third amplification factor based on the ambient temperature;

a first amplifier configured to amplify the first detection result based on a corrected first amplification factor and output an amplified first detection result as a first amplified signal;

a second amplifier configured to amplify the second detection result based on a corrected second amplification factor and output an amplified second detection result as a second amplified signal;

a third amplifier configured to amplify the third detection result based on a corrected third amplification factor and output an amplified third detection result as a third amplified signal;

a first influence degree correction unit indicating an influence degree of the magnetic field generated by the current flowing through each of the second conductor and the third conductor with respect to the first detection result and configured to correct a first influence degree;

a second influence degree correction unit indicating an influence degree of the magnetic field generated by the current flowing through each of the first conductor and the third conductor with respect to the second detection result and configured to correct a second influence degree;

a third influence degree correction unit indicating an influence degree of the magnetic field generated by the current flowing through each of the first conductor and the second conductor with respect to the third detection result and configured to correct a third influence degree;

a first correction unit configured to correct the first amplified signal based on a corrected first influence degree, the second amplified signal, and the third amplified signal;

a second correction unit configured to correct the second amplified signal based on a corrected second influence degree, the first amplified signal, and the third amplified signal; and a third correction unit configured to correct the third amplified signal based on a corrected third influence degree, the first amplified signal, and the second amplified signal.

2. The current sensor according to claim 1, wherein the first influence degree is an index indicating an influence of the magnetic fields which are input to the first magnetic detection unit and generated by the currents flowing through the second conductor and the third conductor when the currents flow through the second conductor and the third conductor at the same time as the first conductor on the first detection result when the current flows only through the first conductor, the second influence degree is an index indicating an influence of the magnetic fields which are input to the second magnetic detection unit and generated by the currents flowing through the first conductor and the third conductor when the currents flow through the first conductor and the third conductor at the same time as the second conductor on the second detection result when the current flows only through the second conductor, and the third influence degree is an index indicating an influence of the magnetic fields which are input to the third magnetic detection unit and generated by the currents flowing through the first conductor and the second conductor when the currents flow through the first conductor and the second conductor at the same time as the third conductor on the third detection result when the current flows only through the third conductor.

3. The current sensor according to claim 1, wherein the first conductor, the second conductor, and the third conductor are provided such that axial centers of the respective conductors are parallel to each other, the first influence degree is defined based on an interval between the first conductor and the second conductor, an interval between the first conductor and the third conductor, a position of the axial center of the second conductor as viewed from the axial center of the first conductor, and a position of the axial center of the third conductor as viewed from the axial center of the first conductor, the second influence degree is defined based on the interval between the first conductor and the second conductor, an interval between the second conductor and the third conductor, a position of the axial center of the first conductor as viewed from the axial center of the second conductor, and a position of the axial center of the third conductor as viewed from the axial center of the second conductor, and the third influence degree is defined based on the interval between the first conductor and the third conductor, the interval between the second conductor and the third conductor, a position of the axial center of the first conductor as viewed from the axial center of the third conductor, and a position of the axial center of the second conductor as viewed from the axial center of the third conductor.

\* \* \* \* \*